United States Patent [19]

Onuki et al.

[11] 4,246,693

[45] Jan. 27, 1981

[54] METHOD OF FABRICATING SEMICONDUCTOR DEVICE BY BONDING TOGETHER SILICON SUBSTRATE AND ELECTRODE OR THE LIKE WITH ALUMINUM

[75] Inventors: Jin Onuki; Ko Soeno, both of Hitachi; Masateru Suwa, Ibaraki; Hisakichi Onodera, Hitachi, all of Japan

[73] Assignee: Hitachi, Ltd., Japan

[21] Appl. No.: 32,018

[22] Filed: Apr. 20, 1979

[30] Foreign Application Priority Data

Apr. 28, 1978 [JP] Japan .................................. 53/49971

[51] Int. Cl.³ .................... H01L 21/22; H01L 21/28; H01L 21/306
[52] U.S. Cl. ...................................... 29/580; 29/590; 148/187; 156/629; 156/647; 156/662; 357/65; 357/71
[58] Field of Search ............... 156/630, 647, 654, 662, 156/629; 29/590, 580; 357/66, 67, 15, 65, 71; 136/89 CC; 148/187

[56] References Cited

U.S. PATENT DOCUMENTS

| | | | |
|---|---|---|---|
| 2,916,806 | 12/1959 | Pudvin | 29/590 |
| 3,450,958 | 6/1969 | Saxena | 357/15 |
| 3,665,594 | 5/1972 | Raithel | 29/590 |
| 3,702,787 | 11/1972 | Lowry et al. | 29/590 |
| 4,137,123 | 1/1979 | Bailey et al. | 156/662 |
| 4,147,564 | 4/1979 | Magee et al. | 156/647 |

OTHER PUBLICATIONS

Roberts et al., "The Controlling Factors . . . Technology", Journal of Material Science, 3 (1968) pp. 110–119.
Matlow et al., "Ohmic . . . Contact", Journal of Applied Physics, vol. 30, No. 4 (4/59), pp. 541–543.
Roberts et al., "The Effects of . . . Devices", Journal of Material Science, 6 (1971), pp. 189–199.

*Primary Examiner*—Jerome W. Massie
*Attorney, Agent, or Firm*—Craig & Antonelli

[57] ABSTRACT

There is provided a method of fabricating a semiconductor device wherein in a bonding surface of a silicon substrate of n-type conductivity are formed recesses having each a bonding surface of a higher order plane index than that of the bonding surface of the silicon substrate, and the substrate and electrodes and the like members are bonded together with an aluminum solder so as to decrease a forward voltage drop FVD. After forming the recesses but prior to the bonding with the aluminum solder, phosphor is diffused into a region ranging from the bonding surface to a depth of 20 microns, thereby further decreasing the forward voltage drop FVD. When cooling after the bonding, a temperature gradient is established so that temperature in the silicon substrate is higher than a temperature in the molten aluminum so that the forward voltage drop FVD can be decreased further.

15 Claims, 10 Drawing Figures

METHOD OF FABRICATING SEMICONDUCTOR DEVICE BY BONDING TOGETHER SILICON SUBSTRATE AND ELECTRODE OR THE LIKE WITH ALUMINUM

This invention relates to a method of fabricating a semiconductor device and more particularly to an improvement in bonding together a silicon substrate and, for example, electrodes with aluminum.

It is general practice to bond electrodes to a silicon substrate with an aluminum solder for the purpose of supporting the silicon substrate or establishing the electrical connection to the same. In some applications, the aluminum solder is also used to bond one silicon substrate to another. Members to be bonded to the silicon substrate are generally termed electrodes herein.

With respect to contacts to silicon substrate using aluminum, one may refer to the Matlow et al article "Ohmic Aluminum-n-Type Silicon Contact", Journal of Applied Physics, Vol. 30, No. 4, (1959) pp. 541–543; the Roberts et al article "The Controlling Factors in Semiconductor Large Area Alloying Technology", Journal of Materials Science 3 (1968) pp. 110–119; or the Roberts et al article "The Effects of Alloying Material on Regrowth-layer Structure in Silicon Power Devices", Journal of Materials Sience 6 (1971), pp. 189–198.

Aluminum is used as a solder because in one respect, it has superior electrical conductivity and bonding ability to the other brazing materials and in another respect, it belongs to a hard solder which is economical.

Where the bonding surface of the silicon substrate has in part n-type conductivity, heat for bonding together silicon and aluminum causes silicon to react with aluminum and accordingly, a regrowth layer of p-type conductivity is formed on the n-type conductivity surface, resulting in unwanted increase in a forward voltage drop, FVD, of the semiconductor device.

One conventional countermeasure for preventing the p-type regrowth layer includes decreasing the thickness of the aluminum solder. Another countermeasure includes providing a foil of five-valence element such as antimony between the silicon substrate and an aluminum foil serving as aluminum solder. Still another countermeasure includes diffusing into the n-type surface a large amount of phosphor which is chosen because of not only being a five-valence element but also being effective to prevent the formation of the regrowth layer. However, these countermeasures are unsatisfactory.

With increased forward voltage drop FVD, the silicon substrate generates a correspondingly large amount of heat when conducting and becomes difficult to cool. Therefore, the amount of current to be passed through the silicon substrate must be suppressed.

It is therefore an object of the invention to provide a method of fabricating a semiconductor device which can ensure that a silicon substrate and electrodes or the like members can be bonded together with aluminum without causing increase in a forward voltage drop.

Another object of the invention is to provide a method of fabricating a seminconductor device which can decrease the forward voltage drop so that heat generated in the semiconductor device can be decreased and a correspondingly large amount of current can be passed therethrough.

Still another object of the invention is to provide a method of fabricating a semiconductor device which can decrease the forward voltage drop FVD without degrading characteristics of the silicon substrate.

According to one aspect of the invention, there is provided a method of fabricating a semiconductor device comprising the steps of: forming, in a bonding surface of a silicon substrate of n-type conductivity which is to be bonded to an electrode, recesses each of which has a bonding surface of a higher order plane index than that of the bonding surface of said silicon substrate; providing an aluminum solder on the bonding surface of said silicon substrate; providing said electrode on said aluminum solder; and integrating said silicon substrate, said aluminum solder and said electrode by heating.

According to another aspect of the invention, there is provided a method of fabricating a semiconductor device comprising the steps of: forming, in a bonding surface of a silicon substrate of n-type conductivity which is to be bonded to an electrode, recesses each of which has a bonding surface of a higher order plane index than that of the bonding surface of said silicon substrate; providing said electrode on the bonding surface of said silicon substrate through an aluminum solder; and integrating said silicon substrate, said aluminum solder and said electrode by heating.

According to still another aspect of the invention, there is provided a method of fabricating a semiconductor device comprising the steps of: forming, in a bonding surface of a silicon substrate of n-type conductivity, recesses each of which has a bonding surface of a higher order plane index than that of the bonding surface of said silicon substrate; and integrating at least two silicon substrates formed with the recesses and an aluminum solder interposed between them by heating.

The above and other objects and features of the invention will be better understood when reading the following detailed description in conjunction with the accompanying drawings, in which.

Figure 1:
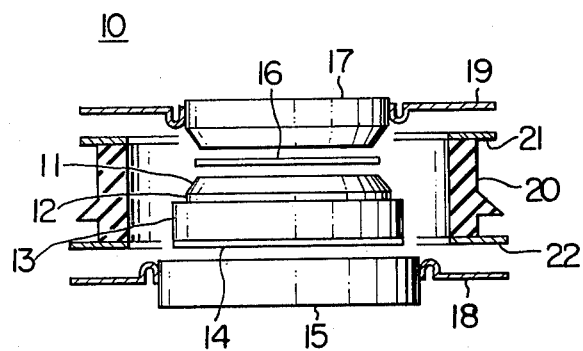
FIG. 1 is a longitudinal sectional view of a semiconductor device in which a silicon substrate and electrodes are bonded together with an aluminum solder.

Referring now to FIG. 1, there is shown an illustration of the disassembled form of a compression bonded type diode generally designated by reference numeral 10 which comprises a silicon substrate 11 having a p-n junction. The silicon substrate is bonded to a supporting electrode 13 of molybdenum or tungsten with an aluminum solder 12. The supporting electrode 13 is provided with a solder layer 14 so as to be bonded to a lower copper electrode 15. The silicon substrate 11 has its upper major surface deposited with an electrode film of gold or the like (not shown) and abuts against an upper copper electrode 17 through an intermediate bumper plate 16 of tungsten. To the upper and lower copper electrodes 17 and 15 are brazed flanges 19 and 18 of Fernico which are also brazed, at their outer circumferential edges, to flanges 21 and 22 of Fernico. The flanges 21 and 22 are mounted to opposite ends of a ceramic sealing member 20. The upper and lower copper electrodes 17 and 15, the flanges 18, 19, 21 and 22, and the ceramic sealing member 20 constitute an airtight enclosure which isolates the silicon substrate 11 from external air.

It is to be noted that a surface stabilizer provided for the exposed end of the p-n junction of the silicon substrate 11 is not depicted.

Figure 2:
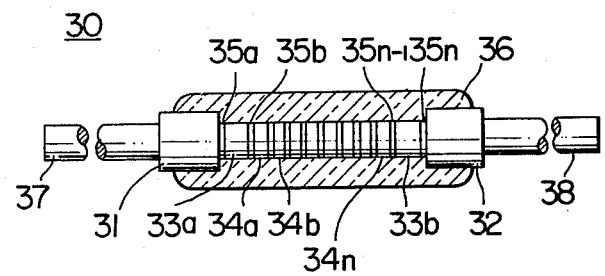
FIG. 2 is a longitudinal sectional view of a seimconductor device in which silicon substrates and electrodes are bonded together with an aluminum solder.

FIG. 2 shows a glass-molded type high voltage diode 30 wherein a pair of molybdenum electrodes 31 and 32 are spaced apart, p-type conductivity silicon spacers 33a and 33b without p-n junctions adjoin the electrodes 31 and 32, and silicon pellets (silicon substrates) 34a, 34b, ..., 34n having p-n junctions are laminated between the spacers 33a and 33b such that their rectifying polarities are aligned in one direction, the electrodes 31 and 32, the spacers 33a and 33b, and the silicon pellets 34a, 34b, ..., 34n being bonded together with aluminum solders 35a, 35b, ... 35n−1, 35n. The resulting assembly is molded with a $ZnO-B_2O_3-SiO_2$ system glass mold 36 which bridges across the electrodes 31 and 32.

The glass mold 36 serves not only as a surface stabilizer for the exposed ends of the p-n junctions of the silicon pellets 34a, 34b, ..., 34n but also as a protector against an external stress. Copper leads 37 and 38 containing a small amount of zirconium are connected to the electrodes 31 and 32 by percussion welding.

When bonding together the silicon substrate 11 and the supporting electrode 13 with the aluminum solder 12 in the case of FIG. 1 diode or bonding together the silicon pellets 34a, 34b, ..., 34n with the aluminum solders 35b, ..., 35n−1 in the case of FIG. 2 diode, a fabricating method according to the invention is applied.

More particularly, the silicon substrate has a bonding surface in the form of an n-type conductivity (111) crystallized surface, and the bonding surface is etched with an aqueous solution mainly containing 5% sodium hydroxide to form therein recesses. Thereafter, phosphor is diffused into the bonding surface at a high concentration (1.08 atomic %; 1 atomic $\% = 5 \times 10^{20}$ atoms/cc) to convert it into an $n^+$-type conductivity bonding surface.

Figure 8:
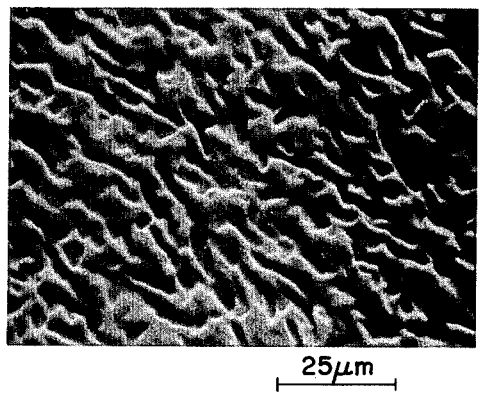
FIG. 8 is a micro-photograph of a silicon substrate surface taken after an etching process in the fabricating method of the invention.

A micro-photograph of the thus prepared $n^+$-type conductivity bonding surface is shown in FIG. 8. It is to be noted that the diffusion of phosphor at the high concentration is to suppress increase in the forward voltage drop by virtue of the ability of phosphor to prevent the formation of regrowth layers and this diffusion is not an indispensable condition for achieving the invention. When observing the $n^+$-type conductivity bonding surface, it was proved that there were formed a great number of recesses in which isolated segmental bonding surfaces were exposed having a higher order plane index than the plane index (111) of the original bonding surface.

Subsequently, one high concentration phosphor diffused $n^+$-type conductivity layer is removed by polishing or etching whereas the other high concentration phosphor diffused $n^+$-type conductivity layer serving as the bonding surface is masked with a diffusion mask through which p-type conductivity impurity (acceptor) such as boron, gallium or the like is diffused to form a p-n junction. Since heating temperature for the formation of the p-n junction is below the melting temperature of silicon, the great number of recesses formed in the $n^+$-type conductivity bonding surface will not distort during the heat treatment.

Then, the diffusion mask and a silicon oxide film formed on the silicon substrate during diffusing acceptor are removed.

Figure 3:
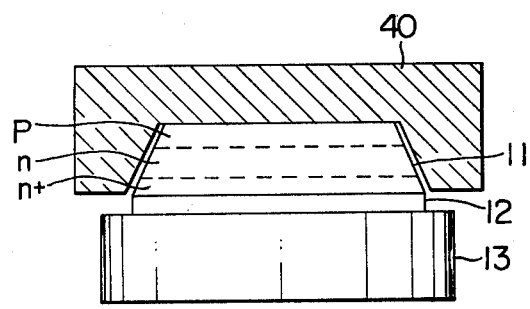
FIG. 3 is a longitudinal sectional view of a silicon substrate useful to show the manner of cooling when bonding in the fabricating method of the invention.

In the next step, the $n^+$-type conductivity bonding surface formed therein with the recesses of the high order plane index is deposited with aluminum in a predetermined thickness by well-known technique such as vapor deposition. Alternatively, the silicon substrate 11 in engagement with the supporting electrode 13 through an aluminum foil 12 on one hand and capped with a heat insulation member 40 made of, for example, graphite on the other hand, as shown in FIG. 3, is heated at a temperature above the melting point of aluminum for a predetermined time and thereafter subjected to cooling, thereby bonding the silicon substrate to the supporting electrode 13. The heat insulation member 40 in close engagement with the silicon substrate 11 is effective to create a negative temperature gradient in which the silicon substrate 11 is kept at a higher temperature than the aluminum solder, so that in the cooling process, crystallization and growth of the regrowth layer may take place in the longitudinal direction perpendicular to the bonding surface but may not in the lateral direction parallel thereto.

Further increased discontinuity ratio of the regrowth layer attributable to the longitudinal growth of the regrowth layer can afford to suppress increase in the forward voltage drop FVD.

"Discontinuity ratio" referred to herein defines a ratio l/L (l being the length of a portion at which a cross-sectional area of the crystallized regrowth layer is not present after bonding, and L being the entire bonding length). This rate is equal to a ratio q/Q (q being the area at which the regrowth layer is crystallized, and Q being the area of the bonding surface).

Figure 4:
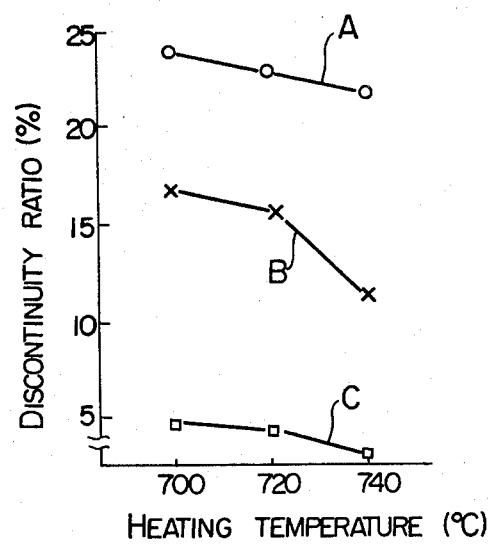
FIG. 4 is a graphic representation showing the relation between heating temperature and discontinuity ratio in accordance with the conventional method and the fabricating method of the invention.

FIG. 4 shows the relation between heating temperature for bonding and discontinuity ratio of the regrowth layer, where curve A represents results of the invention especially governed by the negative temperature gradient, curve B results of the invention especially not governed by the negative temperature gradient, and curve C results of the conventional method wherein any recesses of the high order plane index are not formed and the temperature gradient is positive. As will be seen from FIG. 4, the number of crystallized regrowth layers increases as the heating temperature increases so that the discontinuity ratio is decreased, and the discontinuity ratio is improved according to the invention as compared to the conventional method.

Figure 5:
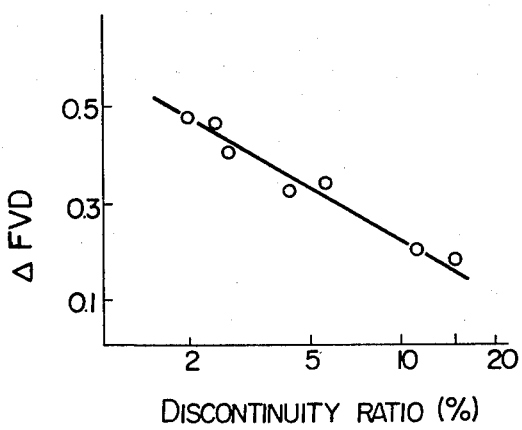
FIG. 5 is a graphic representation showing the relation between discontinuity ratio and increment of forward voltage drop.

FIG. 5 shows the relation between discontinuity ratio and increment ΔFVD of the forward voltage drop due to the regrowth layer. As will be seen from FIG. 5, the forward voltage drop FVD is decreased as the discontinuity ratio increases, as described in the foregoing.

Thus, FIGS. 4 and 5 teach that according to the invention, the discontinuity ratio is increased as compared to the conventional method so that the forward voltage drop can be decreased.

Figure 6:
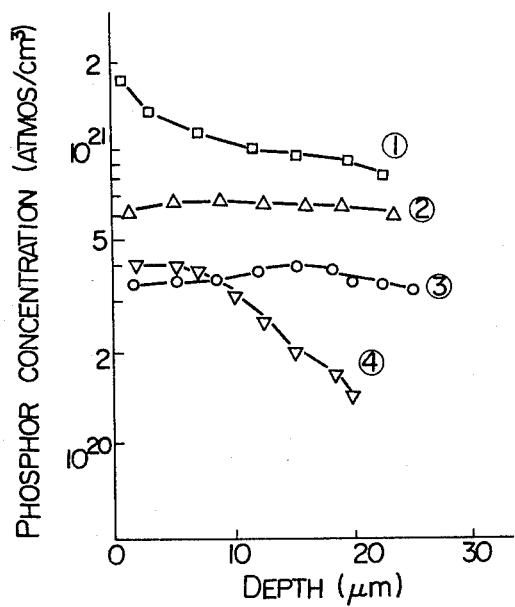
FIG. 6 is a graphic representation showing phosphor concentration profiles in the depth direction of a silicon substrate of a semiconductor device in accordance with the conventional method and the fabricating method of the invention.

FIG. 6 shows phosphor concentration profiles within a region ranging from the n+-type conductivity surface of silicon substrate of the semiconductor device to a depth of 20 microns, where curves ① and ④ represent profiles in the silicon substrate according to the conventional method and curves ② and ③ profiles in the silicon substrate of the semiconductor device according to the invention.

In the case of curve ①, the phosphor concentration at the surface is $1.8 \times 10^{21}$ atoms/cm$^3$ and about $9 \times 10^{20}$ atoms/cm$^3$ at a depth of 20 microns. In the case of curve ④, the phosphor concentration is $4.0 \times 10^{20}$ atoms/cm$^3$ at the surface and $1.5 \times 10^{20}$ atoms/cm$^3$ at a depth of 20 microns. In accordance with the invention, the phosphor concentration is 3 to $7 \times 10^{20}$ atoms/cm$^3$ depending on a depth ranging from the n+-type conductivity surface to 20-micron depth.

Figure 7:
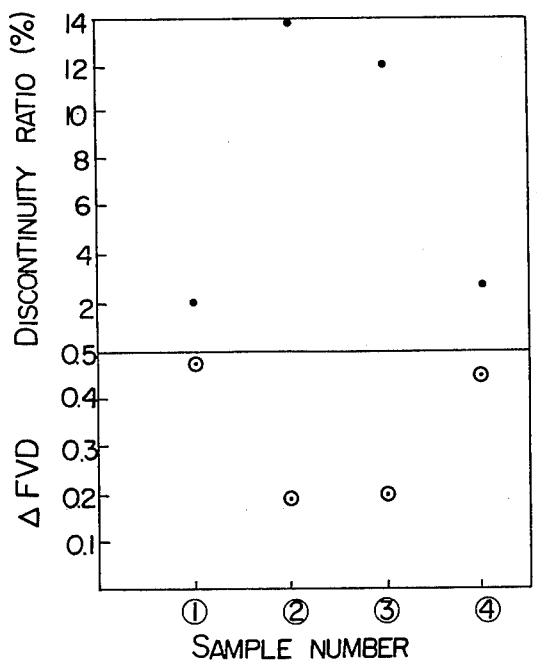
FIG. 7 is a graphic representation showing the relation between discontinuity ratio and increment of forward voltage drop in semiconductor devices fabricated in accordance with the conventional method and the fabricating method of the invention.

Silicon substrates corresponding to curves ①, ②, ③ and ④ were each bonded to a metal plate of molybdenum with aluminum solder to complete a glass-molded diode. The products or samples ① to ④ thus prepared were sheared, and cut surfaces were polished and immersed in a Sirtl etchant (solution of 10 cc water and 5 gram CrO$_3$: HF=1:1) to form regrowth layers which were observed by means of an optical microscope. With these samples, increments ΔFVD of the forward voltage drop FVD due to the regrowth layer were measured, and discontinuity ratio were also measured from the regrowth layers formed in the cut surfaces. Results are shown in FIG. 7, from which it is to be noted that a discontinuity ratio of more than 10% and an increment of less than 0.2 volts are obtained only with samples ② and ③, and that the increment ΔFVD of samples ① and ④ exceeds 0.4 volts and the discontinuity ratio thereof is 1 to 2%.

As described above, it will be appreciated that when phosphor is diffused into a region ranging from the n+-type conductivity bonding surface to a depth of 20 microns at a concentration of 3 to $7 \times 10^{20}$ atoms/cm$^3$, the forward voltage drop FVD can be decreased.

The bonding surface subjected to the phosphor diffusion is formed with other recesses than those created by etching when undergoing bonding with aluminum. The additional recesses due to phosphor diffusion contribute to increase in the discontinuity ratio.

Accordingly, when the phosphor concentration is less than $3 \times 10^{20}$ atoms/cm$^3$, the formation of additional recesses is insufficient, resulting in a large increment ΔFVD. Conversely, when the phosphor concentration is more than $7 \times 10^{20}$ atoms/cm$^3$, the additional recesses may be created excessively and it follows that the bonding surface becomes excessively irregular, resulting in the same surface condition as that of the conventional bonding surface not formed with recesses and consequent increase in the increment ΔFVD.

Figure 9:
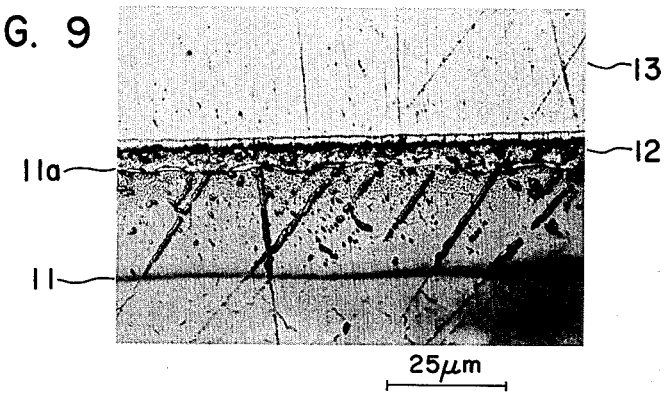
FIG. 9 is a mirco-photograph of a bonding region in a silicon substrate of a semiconductor device fabricated in accordance with the fabricating method of the invention.
Figure 10:
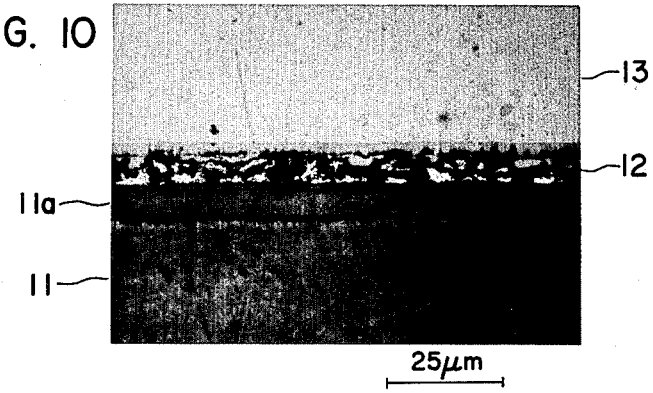
FIG. 10 is a micro-photograph of a bonding region in a silicon substrate of a semiconductor device fabricated in accordance with the conventional method.

FIGS. 9 and 10 show micro-photographs of sectional structures of semiconductor devices in accordance with the invention and the conventional method, respectively. According to the invention, a regrowth layer 11a is broken at an internal whereas according to the conventional method, the crystallization and growth of a regrowth layer 11a continuously extends all over the n+-type conductivity bonding surface of the silicon substrate 11.

Where the silicon spacers 33a, 33b and the silicon pellets 34a, 34b, ..., 34n are bonded together with the aluminum solders 35a, 35b, ..., 35n to form a lamination as in the glass-mold type high voltage diode 30 of FIG. 2, it is difficult to establish the negative temperature gradient when cooling. However, the provision of the recesses of high order plane index in the n-type conductivity surface can ensure that the discontinuity ratio is sufficiently increased and consequently the forward voltage drop is decreased, as shown in FIGS. 4 and 5.

The formation of the recesses of high order plane index does not rely on etching alone. But, if the recesses are formed mechanically, the working stress persists in the surface of silicon substrate and tends to adversely affect electrical and mechanical characteristics of the silicon substrate. Therefore, it is desirable to employ such a process as etching which is free from working stress and is of high workability.

As an etchant, an alkaline aqueous solution is preferred. Especially, an aqueous solution containing sodium hydroxide or kalium hydroxide is effective.

As described above, the fabricating method of the invention is effective for bonding the electrode and the like member to the n-type conductivity surface, and can be applied to various silicon substrates of transistors, thyristors and the like, in addition to the silicon substrates of diodes.

A silicon substrate in which the p-type conductivity layer and the n-type conductivity layer coexist at the bonding surface is typically used in a bidirectional thyristor structure wherein a pair of thyristors are integrated in reverse parallel within the same silicon substrate (see U.S. Pat. No. 3,391,310) or in a reverse conducting thyristor structure wherein a diode and a thyristor are integrated in reverse parallel within the same silicon substrate (see U.S. Pat. No. 3,978,514). The invention is also applicable to this type of bonding surface.

As the forward voltage drop is decreased, the amount of heat generated in the semiconductor device of the invention during conduction can be decreased correspondingly. Further, the decreased heat generation can increase the amount of current correspondingly.

What is claimed is:

1. In a method of fabricating a semiconductor device wherein a silicon substrate having at least in part an n-type conductivity is bonded to a second silicon substrate or to an electrode with an aluminum solder by heating said silicon substrate, aluminum solder, and second silicon substrate or electrode, whereby a p-type regrowth layer is formed on the n-type conductivity surface of said silicon substrate, thereby increasing the forward voltage drop of the semiconductor device, the process of substantially preventing the increase in the forward voltage drop of said semiconductor device comprising forming in the bonding surface of n-type conductivity of said silicon substrate which is to be bonded to said second silicon substrate or to said electrode, prior to said heating, recesses each of which has a bonding surface of a higher order plane index than that of said bonding surface.

2. A method of fabricating a semiconductor device comprising the steps of:

forming, in a bonding surface of a silicon substrate of n-type conductivity which is to be bonded to an electrode, recesses each of which has a bonding surface of a higher order plane index than that of the bonding surface of said silicon substrate;

providing said electrode on the bonding surface of said silicon substrate through an aluminum solder; and integrating said silicon substrate, said aluminum solder and said electrode by heating, whereby increase of the forward voltage drop of said semiconductor device, caused by formation of a p-type conductivity layer in said bonding surface, is substantially prevented.

3. A method of fabricating a semiconductor device according to claim 2, wherein said recesses are formed by etching.

4. A method of fabricating a semiconductor device according to claim 3, wherein said etching is effected with an etchant of alkaline aqueous solution.

5. A method of fabricating a semiconductor device according to claim 2, wherein after forming said recesses, phosphor is diffused into a region ranging from the bonding surface to a depth of 20 microns at a concentration of 3 to $7 \times 10^{20}$ atoms/cm$^3$.

6. A method of fabricating a semiconductor device according to claim 2, wherein after forming said recesses, an acceptor is diffused into said silicon substrate to form a predetermined p-n junction.

7. A method of fabricating a semiconductor device according to claim 2, wherein when cooling after said heating for said integration, a temperature gradient is established so that temperature in said silicon substrate is higher than a temperature in molten aluminum.

8. A method of fabricating a semiconductor device according to claim 7, wherein said temperature gradient is established by placing the silicon substrate in contact with a heat insulation member.

9. A method of fabricating a semiconductor device according to claim 8, wherein said heat insulation member is made of graphite.

10. A method of fabricating a semiconductor device comprising the steps of:

forming, in a bonding surface of a silicon substrate of n-type conductivity, recesses each of which has a bonding surface of a higher order plane index than that of the bonding surface of said silicon substrate; and integrating at least two silicon substrates formed with the recesses and an aluminum solder interposed between them by heating, whereby increase of the forward voltage drop of said semiconductor device, caused by formation of a p-type conductivity layer in said bonding surface, is substantially prevented.

11. A method of fabricating a semiconductor device according to claim 10, wherein at least one of said silicon substrates has one surface in contact with the aluminum solder which is formed with the recesses.

12. A method of fabricating a semiconductor device according to claim 10, wherein said recesses are formed by etching.

13. A method of fabricating a semiconductor device according to claim 12, wherein said etching is effected with an etchant of alkaline aqueous solution.

14. A method of fabricating a semiconductor device according to claim 10, wherein after forming said recesses, an acceptor is diffused into said silicon substrate to form a predetermined p-n junction.

15. A method of fabricating a semiconductor device according to claim 4 or 13, wherein said alkaline aqueous solution is sodium hydroxide or potassium hydroxide.

* * * * *